United States Patent [19]

Hirata

[11] Patent Number: 5,502,649
[45] Date of Patent: Mar. 26, 1996

[54] METHOD AND APPARATUS FOR DETERMINING POWER SUPPLY WIRINGS OF A SEMICONDUCTOR DEVICE

[75] Inventor: Yukio Hirata, Kasugai, Japan

[73] Assignees: Fujitsu Limited, Kawasaki; Fujitsu VLSI Limited, Kasugai, both of Japan

[21] Appl. No.: 494,146

[22] Filed: Jun. 23, 1995

Related U.S. Application Data

[63] Continuation of Ser. No. 795,148, Nov. 20, 1991, abandoned.

[30] Foreign Application Priority Data

Nov. 21, 1990 [JP] Japan ................................ 2-316789

[51] Int. Cl.⁶ ................................................... H01L 21/66
[52] U.S. Cl. ........................ 364/490; 364/488; 364/489; 364/491; 364/578
[58] Field of Search ................................ 364/488, 489, 364/490, 491, 578; 437/51

[56] References Cited

U.S. PATENT DOCUMENTS

| | | | |
|---|---|---|---|
| 5,051,938 | 9/1991 | Hyduke | 364/578 |
| 5,145,800 | 9/1992 | Arai et al. | 437/51 |
| 5,218,551 | 6/1993 | Agrawal et al. | 364/491 |

FOREIGN PATENT DOCUMENTS

| | | | |
|---|---|---|---|
| 173855 | of 1985 | Japan | H01L 21/82 |
| 61-10253 | 1/1986 | Japan . | |
| 63-104443 | 5/1988 | Japan . | |
| 63-293854 | 11/1988 | Japan . | |
| 1-205546 | 8/1989 | Japan . | |
| 2-171861 | 7/1990 | Japan . | |

*Primary Examiner*—Kevin J. Teska
*Assistant Examiner*—Stephen J. Walder, Jr.
*Attorney, Agent, or Firm*—Nikaido, Marmelstein, Murray & Oram

[57] ABSTRACT

An apparatus for determining power supply wirings of a semiconductor device includes a unit for executing a logic simulation based on both data concerning each of logic circuit blocks constituting the semiconductor device and data concerning signals for testing operations of the device, and thereby generating a respective output signal data for the logic circuit blocks, a unit for computing a respective operational frequency of the logic circuit blocks based on the generated output signal data, and a unit for computing a respective wiring width of each power supply line for supplying each of the logic circuit blocks with powers. The respective wiring width of each power supply line is determined based on the computed respective operational frequency of the logic circuit blocks and a plurality of wiring widths of respective power supply lines optimumly selected for each of a plurality of operational frequencies in advance. As a result, it is possible to ensure a reliable operation of each logic circuit block and simultaneously realize a reduction in the chip size.

9 Claims, 6 Drawing Sheets

METHOD AND APPARATUS FOR DETERMINING POWER SUPPLY WIRINGS OF A SEMICONDUCTOR DEVICE

This application is a continuation of application Ser. No. 07/795,148 filed Nov. 20, 1991 now abandoned.

BACKGROUND OF THE INVENTION

1. Field of the Invention

The present invention relates to a semiconductor device, more particularly, to a technique of determining power supply wirings in a semiconductor integrated circuit device.

2. Description of the Related Art

In recent years, approaches to a high integration and high speed operation of a large scale integration (LSI) device have been carried out. Thus, it has been demanded to ensure a reliable operation of the device and reduce a chip size thereof. To cope with this, it is necessary to adjust a wiring width of a respective power supply line for feeding a power supply voltage to each logic circuit block, in accordance with a respective operational frequency of the logic circuit blocks.

As an example of a conventional semiconductor device having such a power supply line, a semiconductor device of multilayer wiring structure is known which includes a first wiring layer where basic power supply lines each having a predetermined wiring width are provided for each logic circuit block, and a second wiring layer where compensating basic power supply lines are provided with a predetermined space therebetween. Note, the power supply line for feeding a power supply voltage to the respective logic circuit block is composed of the basic power supply line or lines in the first wiring layer and the compensating basic power supply line or lines in the second wiring layer which passes above the logic circuit block concerned. In the conventional layout of the power supply wirings, a wiring width of the power supply line for the respective logic circuit block has been determined irrespective of a respective operational frequency dependent on an input signal of each logic circuit block.

The conventional determination of power supply wirings does not take into consideration the operational frequencies of each logic circuit block, and thus, poses problems below. Namely, since the compensating basic power supply lines in the second wiring layer are provided with a constant space therebetween, they provide too many or excessive wirings for a logic circuit block having a relatively low operational frequency. Thus, a problem occurs in that the second wiring layer is wastefully used resulting in an increase in the chip size. On the other hand, as to a logic circuit block having a relatively high operational frequency, there is a possibility in that the compensating basic power supply lines in the second wiring layer come short in number. In this case, a problem arises in that it is impossible to ensure a reliable operation of the logic circuit block concerned.

SUMMARY OF THE INVENTION

An object of the present invention is to provide a method and apparatus for determining power supply wirings, which can reliably ensure an operation of each logic circuit block in a semiconductor device and simultaneously contribute to a reduction in the chip size thereof.

According to one aspect of the present invention, there is provided a method of determining power supply wirings of a semiconductor device, including the steps of: executing a logic simulation based on both data concerning each of logic circuit blocks constituting the semiconductor device and data concerning signals for testing operations of the semiconductor device; computing a respective operational frequency of the logic circuit blocks based on a result of the logic simulation; and determining a respective wiring width of each power supply line for supplying each of the logic circuit blocks with powers, in accordance with the respective operational frequency of the logic circuit blocks.

According to another aspect of the present invention, there is provided an apparatus for determining power supply wirings of a semiconductor device, including: a logic simulating unit for executing a logic simulation based on both data concerning each of logic circuit blocks constituting the semiconductor device and data concerning signals for testing operations of the semiconductor device, and thereby generating a respective output signal data for the logic circuit blocks; a frequency computing unit for computing a respective operational frequency of the logic circuit blocks based on the output signal data from the logic simulating unit; and a power supply line determining unit for computing a respective wiring width of each power supply line for supplying each of the logic circuit blocks with powers, based on the respective operational frequency of the logic circuit blocks computed by the frequency computing unit and a plurality of wiring widths of respective power supply lines optimumly selected for each of a plurality of operational frequencies in advance.

In a preferable aspect of the present invention, the power supply wiring determining apparatus may be constituted such that the respective power supply line for each logic circuit block comprises at least one basic power supply line having a predetermined wiring width, and the power supply line determining unit comprises a unit for computing the number of the basic power supply line constituting the respective power supply line for each logic circuit block, according to the operational frequency of the logic circuit block concerned, and a unit, responsive to the computed number, for computing both a wiring width of the power supply line concerned and a wiring space between each basic power supply line.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Figure 1:
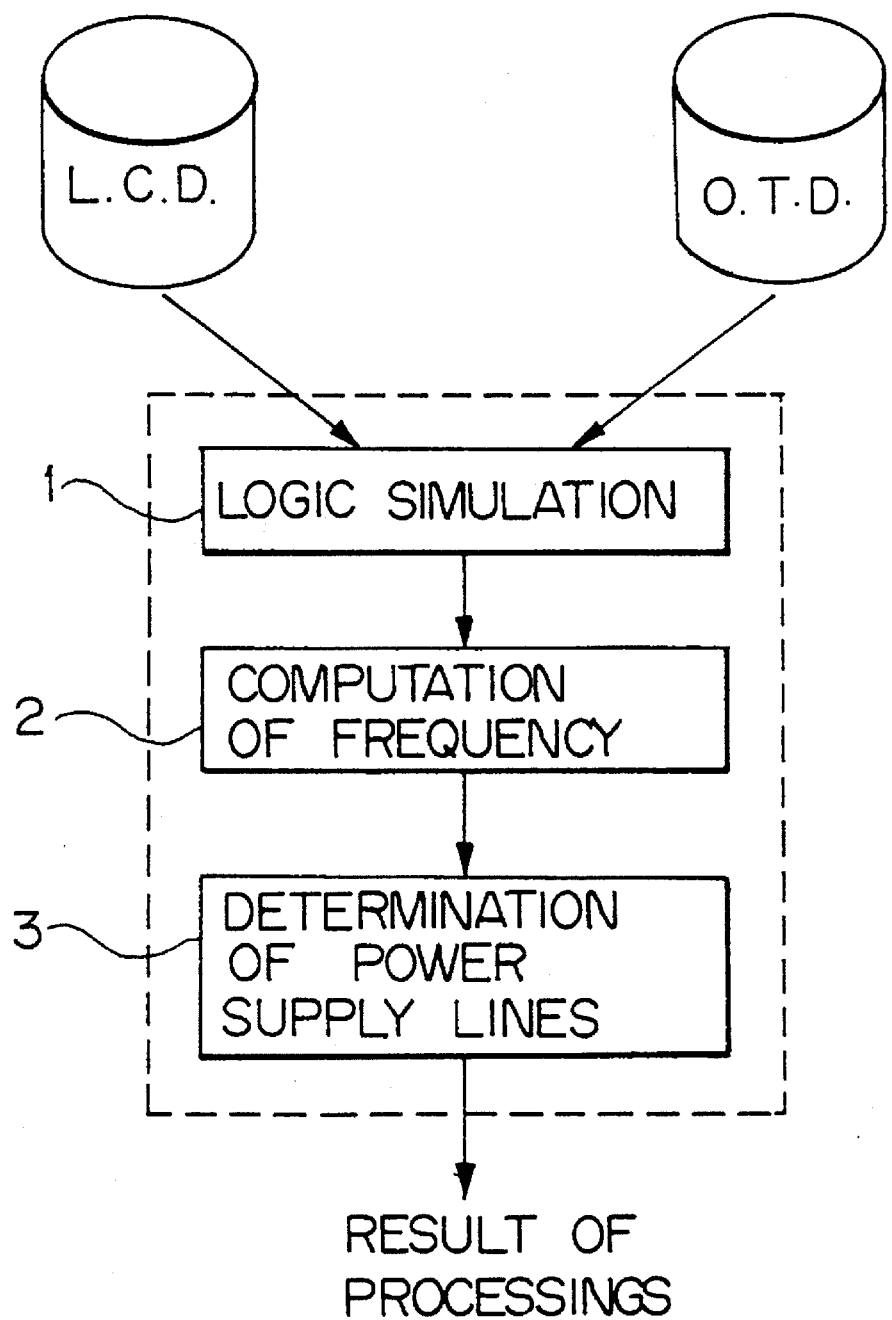
FIG. 1 is a block diagram for explaining the principle of the power supply wiring determining apparatus according to the present invention.

FIG. 1 illustrates the principle constitution of the power supply wiring determining apparatus according to the present invention.

In the illustration, reference 1 denotes a logic simulating unit, which executes a logic simulation based on both data (L.C.D.) concerning each of logic circuit blocks constituting a semiconductor device and data (O.T. D.) concerning signals for testing operations of the semiconductor device, and generates a respective output signal data for the logic circuit blocks. Reference 2 denotes a frequency computing unit, which computes a respective operational frequency of the logic circuit blocks based on the output signal data from the logic simulating unit 1. Also, reference 3 denotes a power supply line determining unit, which computes a respective wiring width of each power supply line for supplying each of the logic circuit blocks with powers, based on the respective operational frequency of the logic circuit blocks computed by the frequency computing unit 2 and a plurality of wiring widths of respective power supply lines optimumly selected for each of a plurality of operational frequencies in advance.

According to the above constitution, since the wiring width of the power supply line for each logic circuit block is computed depending on the operational frequency of the logic circuit block concerned, it is possible to remove a disadvantage in that the respective wiring width of the power supply line for each logic circuit block becomes excessive or runs short in amount. As a result, it is possible to reliably ensure an operation of each logic circuit block.

Also, where the respective power supply line for each logic circuit block is constituted by at least one basic power supply line having a predetermined wiring width, a wiring width of the power supply line concerned and a wiring space between each basic power supply line can be computed by computing the number of the basic power supply line. Thus, it is possible to remove a problem in that the number of the basic power supply line becomes excessive for each logic circuit block. Therefore, regions corresponding to the wiring space are prevented from being wastefully used and thus an efficiency in wiring is certainly improved. This contributes to a reduction in the chip size.

Next, one example embodying the present invention will be explained with reference to FIGS. 2 to 6.

Figure 2:
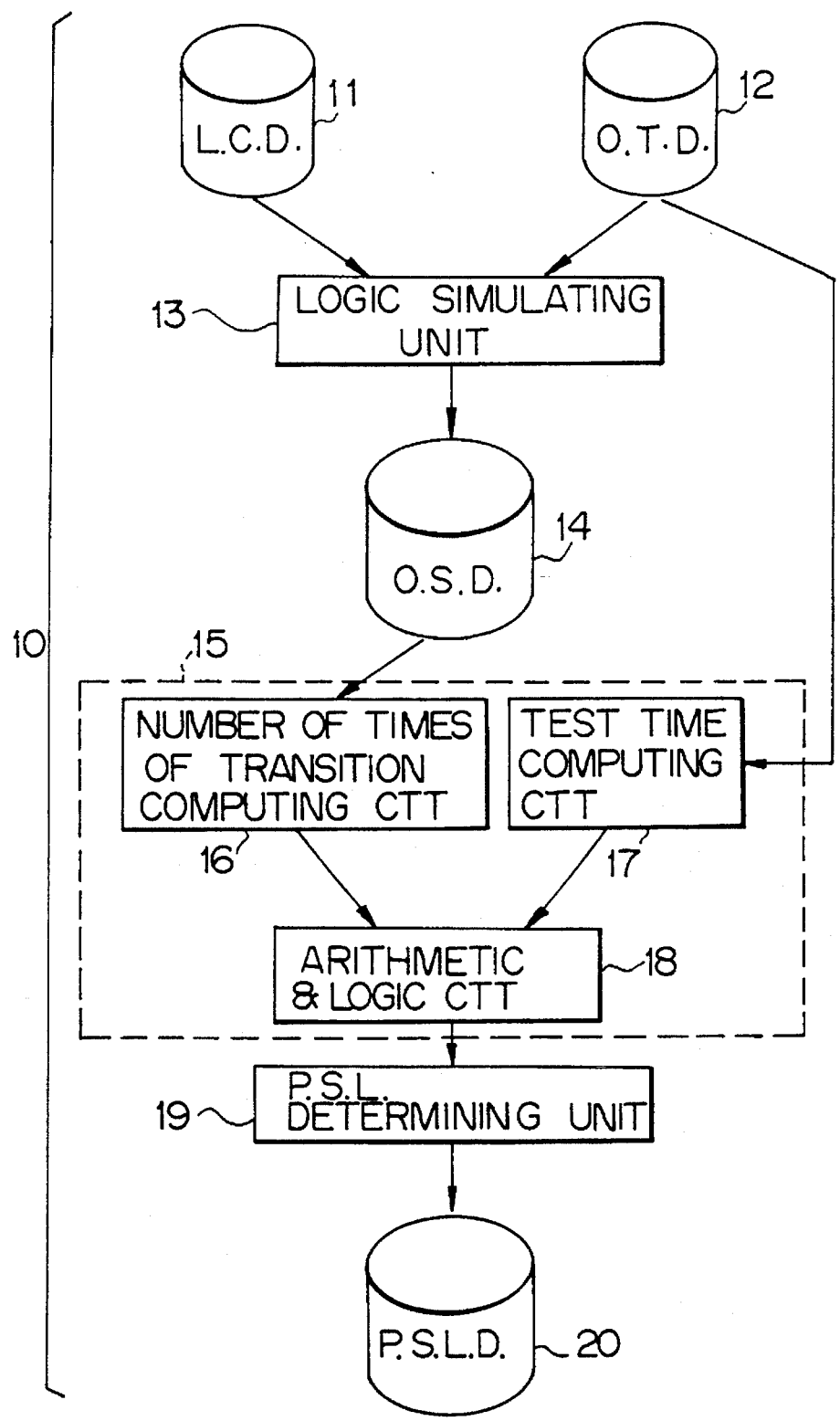
FIG. 2 is a block diagram illustrating a constitution of the power supply wiring determining apparatus as an embodiment of the present invention.
Figure 3:
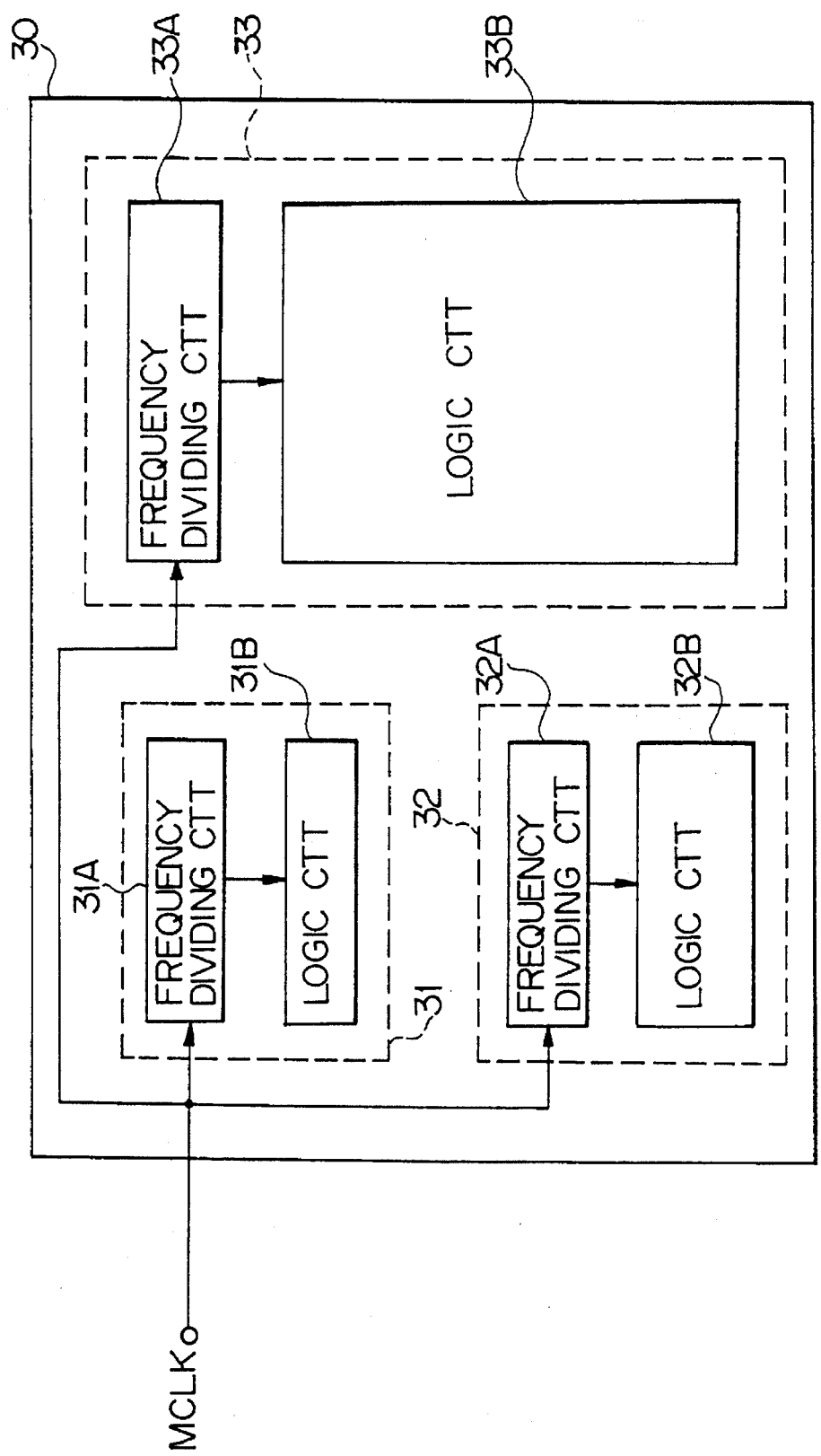
FIG. 3 is a block diagram illustrating a constitution of an LSI, for explaining logic designing data stored in the logic circuit data file 11 shown in FIG. 2.

FIG. 2 illustrates a constitution of the power supply wiring determining apparatus as an embodiment of the present invention.

The illustrated power supply wiring determining apparatus 10 is constituted by a logic circuit data (L.C.D.) file 11, an operation test data (O.T.D.) file 12, a logic simulating unit 13, an output signal data (O. S.D.) file 14, a frequency computing unit 15, a power supply line determining unit 19, and a power supply line data (P.S.L.D.) file 20.

The logic circuit data file 11 stores data concerning each logic circuit block constituting an LSI device which is an object for the determination of power supply wirings. For example, referring to FIG. 3 which illustrates a constitution of an LSI 30, the logic circuit data file 11 stores data concerning a logic circuit block 31 including a frequency dividing circuit 31A and a logic circuit 31B, data concerning a logic circuit block 32 including a frequency dividing circuit 32A and a logic circuit 32B, and data concerning a logic circuit block 33 including a frequency dividing circuit 33A and a logic circuit 33B. Note, in FIG. 3, reference MCLK denotes a main clock signal.

The operation test data file 12 stores data concerning signals for testing operations of the LSI device. For example, referring to FIG. 4 which illustrates a signal waveform applied to the LSI device, the operation test data file 12 stores data concerning the main clock signal MCLK having a period "T" and a pattern number "Pn".

Figure 4:
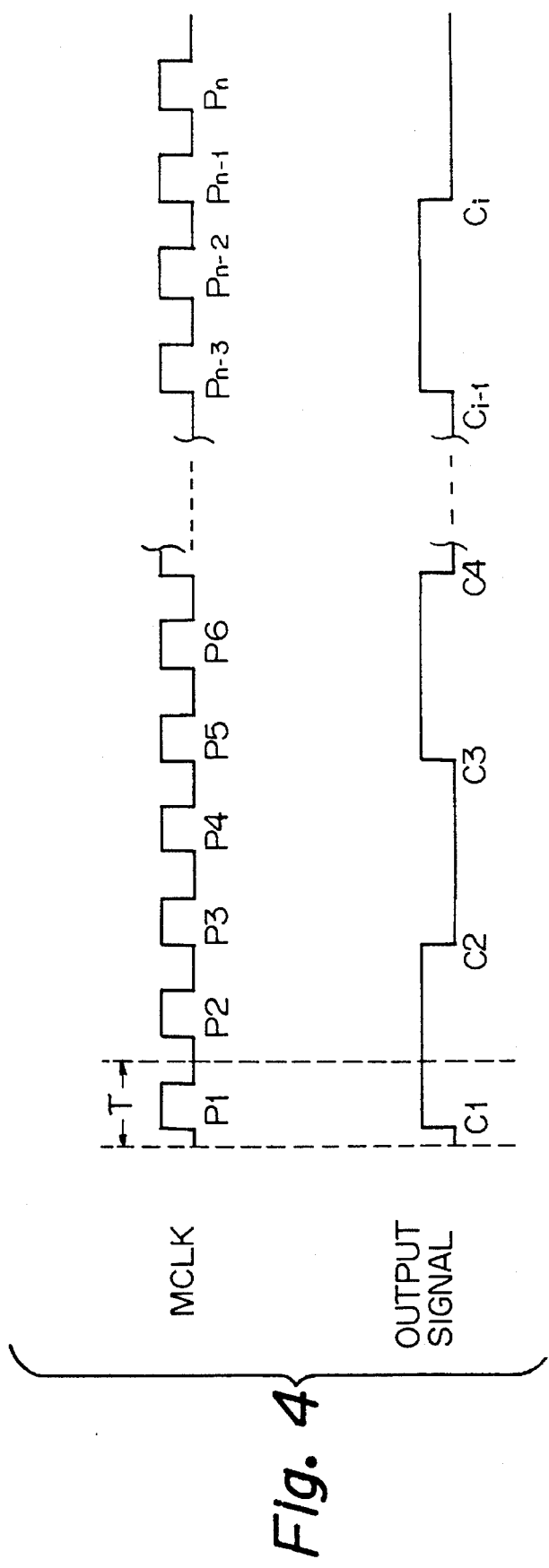
FIG. 4 is a signal waveform diagram for explaining the operation of the apparatus of FIG. 2.

The logic simulating unit 13 receives both the data concerning each logic circuit block from the logic circuit data file 11 and the data concerning the main clock signal MCLK from the operation test data file 12 and thus executes a logic simulation. The logic simulating unit 13 generates an output signal data for each logic circuit block, respectively, e.g., data of an output signal as shown in FIG. 4. The generated output signal data are stored in the output signal data file 14.

The frequency computing unit 15 includes a circuit 16 for computing the number of times of transition, a circuit 17 for computing a test time, and an arithmetic and logic circuit 18.

The number of times of transition computing circuit 16 receives an output signal data (e.g., data of the output signal shown in FIG. 4) from the output signal data file 14 and thus computes the number of times (Ci) of "H" level to "L" level transition or "L" level to "H" level transition of the output signal within a given test time.

The test time computing circuit 17 receives an operation test data (i.e., data of the main clock signal MCLK shown in FIG. 4), which corresponds to the output signal data which the circuit 16 received from the output signal data file 14, from the operation test data file 12 and thus carries out a multiplication of the period "T" by the pattern number "Pn" of the main clock signal MCLK to thereby compute the test time (T×Pn).

The arithmetic and logic circuit 18 divides the number of times of transition (Ci) of the output signal data computed by the circuit 16 by two (2) and further divides the result by the test time (T×Pn) computed by the circuit 17, to thereby compute an operational frequency "F". Namely, $$F = Ci/2/(T \times Pn) \tag{1}$$

Data concerning the computed operational frequency "F" is output to the subsequent power supply line determining unit 19.

The power supply line determining unit 19 includes a storing unit (not shown) in which information on a respective power supply line for supplying each logic circuit block with powers is stored. The information includes data concerning a wiring width and a wiring space of the respective power supply line, which are optimumly selected for each operational frequency of a plurality of logic circuit blocks in advance. In the present embodiment, the respective power supply line for each logic circuit block includes at least one basic power supply line having a predetermined wiring width.

Figure 5:
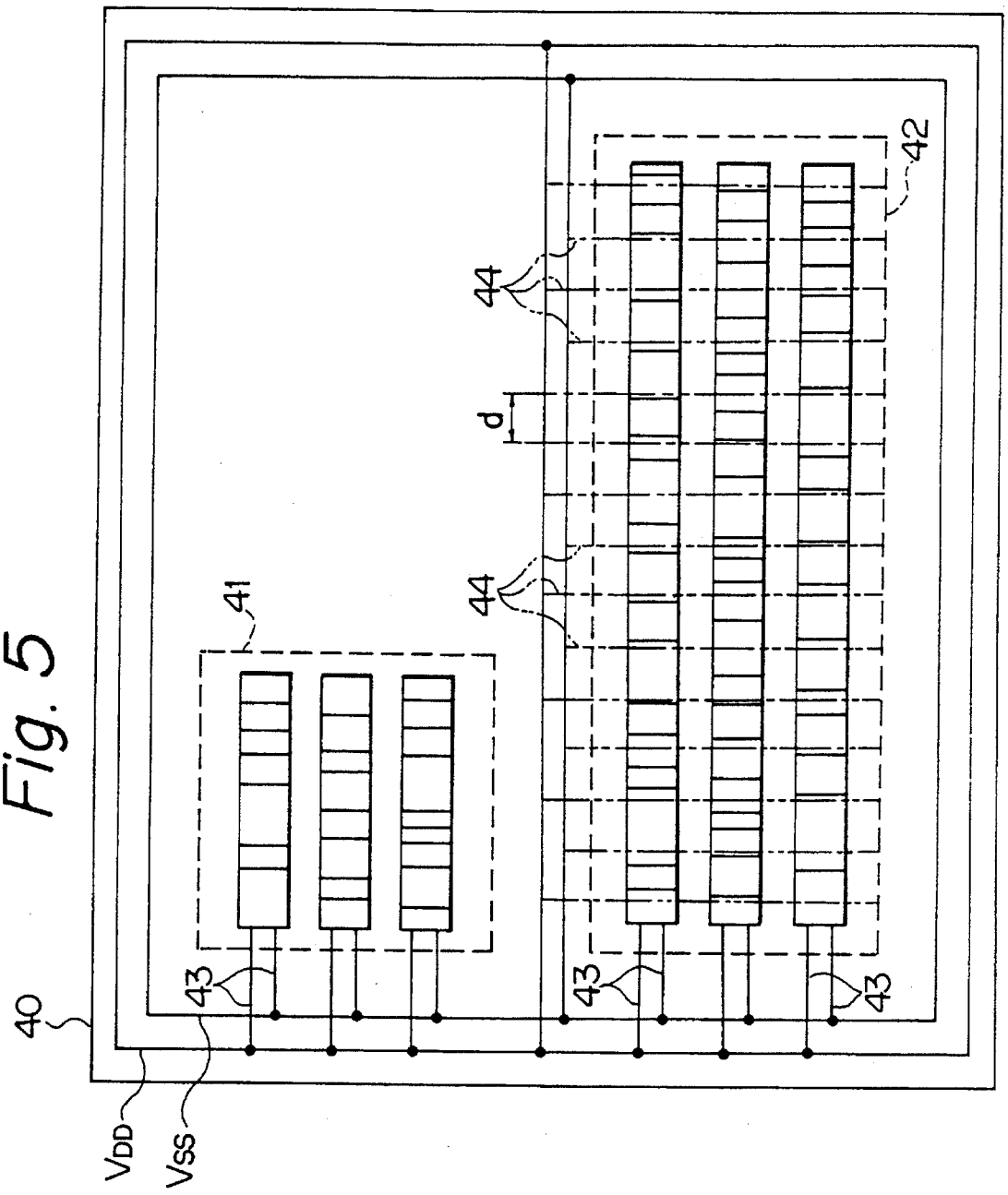
FIG. 5 is a view schematically showing a layout after the processing of the arrangement of the logic circuit blocks and power supply wirings.

For example, referring to FIG. 5, the power supply line for each logic circuit block includes at least basic power supply lines 43 each having a predetermined wiring width, which are included in a first wiring layer and extend in the left to right direction from main power supply lines VDD and VSS provided along the periphery of a semiconductor chip 40, and, when necessary, includes compensating basic power supply lines 44 each provided with a predetermined wiring space "d" therebetween, which are included in a second wiring layer, extend in the up to down direction and pass above the logic circuit block concerned. Note, the wiring width of the compensating basic power supply line 44 is selected to be equal to that of the basic power supply line 43.

Thus, the respective wiring width of the power supply line for each logic circuit block is defined by the sum of wiring widths of all of the basic power supply lines 43,44 constituting the power supply line concerned. Also, the predetermined wiring space "d" is determined based on the number of the compensating basic power supply lines 44 constituting the power supply line concerned, and the size of the logic circuit block concerned.

The power supply line determining unit 19 computes the number of the basic power supply lines 43,44 based on the above set values and the operational frequency "F" computed by the arithmetic and logic circuit 18 and thereby computes both the wiring width of the power supply line for the logic circuit block concerned and the wiring space "d" between the compensating basic power supply lines 44. The computed data concerning the power supply lines are stored in the power supply line data file 20.

FIG. 5 schematically shows a layout of logic circuit blocks 41,42 on a semiconductor chip 40 according to the logic circuit block data of the logic circuit data file 11, and a layout of power supply lines (i.e., basic power supply lines 43,44) according to the power supply line data of the power supply line data file 20, corresponding to the logic circuit blocks 41,42. Note, the logic circuit block 41 is one having a relatively low operational frequency, while the logic circuit block 42 is one having a relatively high operational frequency.

As shown in FIG. 5, the power supply line for the logic circuit block 41 is constituted only by the basic power supply lines 43 in the first wiring layer. On the other hand, the power supply line for the logic circuit block 42 is constituted by the basic power supply lines 43 in the first wiring layer and a plurality of compensating basic power supply lines 44 which are included in the second wiring layer and provided with the wiring space "d" therebetween.

As explained above, according to the present embodiment, the optimum wiring width of the power supply line for each logic circuit block is computed depending on the operational frequency "F" of the logic circuit block concerned, in the form of the number of the basic power supply lines 43,44 each having the predetermined wiring width. As a result, it is possible to remove a disadvantage in that the respective wiring width of the power supply line for each logic circuit block becomes excessive or runs short in amount. Thus, it is possible to ensure a reliable operation of each logic circuit block.

Also, as to the second wiring layer, the number of the compensating basic power supply lines 44 and the wiring space "d" therebetween for each logic circuit block are computed according to the operational frequency "F" of the logic circuit block concerned. Thus, it is possible to remove a problem in that the basic power supply lines 44 are excessively provided for each logic circuit block. Therefore, regions corresponding to the wiring spaces of the second wiring layer are prevented from being wastefully used and thus an efficiency in wiring is certainly improved. This contributes to a reduction in the chip size.

In particular, as to the logic circuit block 41 having a low operational frequency where the compensating basic power supply lines 44 are not required (see FIG. 5), it is possible to use regions of the second wiring layer above the logic circuit block 41 as other wiring regions and thus certainly improve the efficiency in wiring to thereby reduce the chip size.

Figure 6:
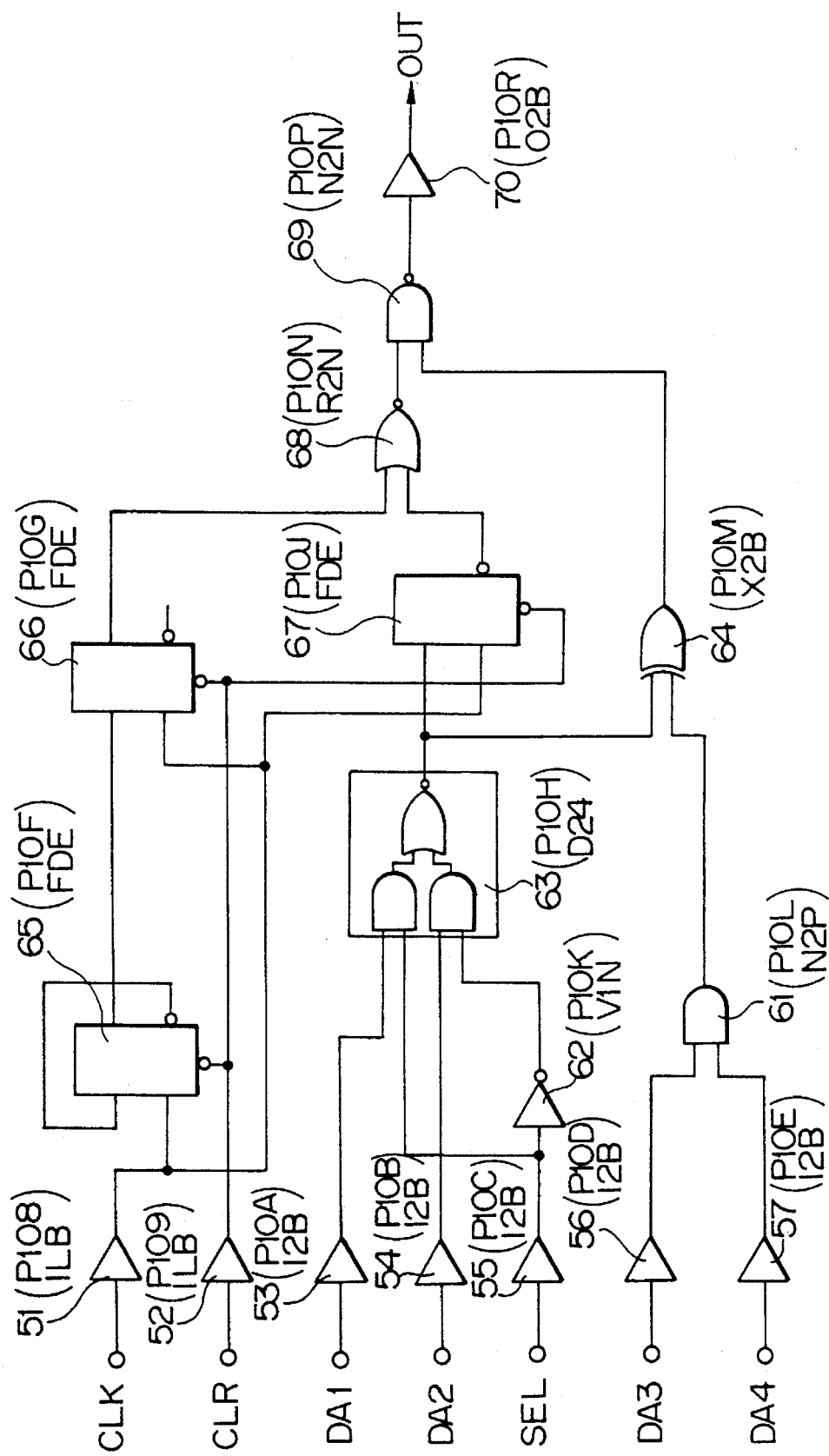
FIG. 6 is a circuit diagram illustrating an example of a concrete logic circuit block which is an object for the determination of power supply wirings.

FIG. 6 illustrates an example of a concrete logic circuit block which is an object for the determination of power supply wirings.

In the illustration, references 51 to 57 denote input buffers each responsive to a clock signal CLK, a clear signal CLR, data signals DA1, DA2, a select signal SEL, and data signals DA3, DA4, respectively; reference 61 an AND gate responsive to each output of the input buffers 56,57; reference 62 an inverter responsive to an output of the input buffer 55; reference 63 a gate circuit including two AND gates and one NOR gate and responsive to each output of the input buffers 53,54,55 and 62; reference 64 an exclusive-OR gate responsive to each output of the gate circuit 63 and the AND gate 61; reference 65 a flip-flop responsive to each output of the input buffers 51,52; reference 66 a flip-flop responsive to each output of the input buffers 51,52 and the flip-flop 65; reference 67 a flip-flop responsive to each output of the input buffers 51,52 and the gate circuit 63; reference 68 a NOR gate responsive to each output of the flip-flops 66,67; reference 69 a NAND gate responsive to each output of the NOR gate 68 and the exclusive-OR gate 64; and reference 70 an output buffer responsive to an output of the NAND gate 69.

For reference, a list of logic circuit data corresponding to the logic circuit block of FIG. 6 is shown in Table 1 below. Note, marks O2B, N2N, R2N, . . . , indicate a name of respective cells (each logic element or gate in FIG. 6), and marks P10R, P10P, P10N, . . . , indicate a specific name of respective cells. Also, marks P1 OS, P1 OR, P1 OP, . . . , indicate a name of respective nets between each cell.

TABLE 1

| | % TERMINAL PART % | | | |
|---|---|---|---|---|
| INPUTS | : .DA1 | , .DA2 | , .CLK | , .CLR , |
| | .DA4 | , .DA3 | , .SEL | ; |
| OUTPUTS | : .OUT | ; | | |
| | % TYPE PART % | | | |
| TYPES | ; | | | |
| O2B | : P10R | ; | | |
| N2N | : P10P | ; | | |
| R2N | : P10N | ; | | |
| X2B | : P10M | ; | | |
| N2P | : P10L | ; | | |
| V1N | : P10K | ; | | |
| FDE | : P10J | , P10G | , P10F | ; |
| D24 | : P10H | ; | | |
| I2B | : P10E | , P10D | , P10C | , P10B , P10A ; |
| ILB | : P109 | , P108 | ; | |
| ENDTYPES | ; | | | |
| | % NET PART % | | | |
| NETS | | | | |
| P1 OS | : .OUT | , P10R | . X | ; |
| P1 OR | : P10R | . UT | , P10P | . X ; |
| P1 OP | : P10P | . A1 | , P10N | . X ; |
| P1 ON | : P10P | . A2 | , P10M | . X ; |
| P1 OM | : P10N | . A1 | , P10G | . Q ; |
| P1 OL | : P10N | . A2 | , P10J | . XQ ; |
| . | . | . | . | . |
| . | . | . | . | . |
| . | . | . | . | . |
| ENDNETS | ; | | | |

Also, a list of data for testing operations of the logic circuit block of FIG. 6 is shown in Table 2 below. Note, the test pattern is operated with a cycle of 100 [ns], i.e., a frequency of 10 [MHz].

TABLE 2

| TIMING | : CYCLE | = 100 |
|---|---|---|
| | ; | |
| INTIM | : NAME | = CLK |
| | : PP1 | = 7 ,25 |

TABLE 2-continued

| | | |
|---|---|---|
| INTIM | : NAME | = CLR |
| | : DT | = 5 |
| | ; | |
| INTIM | : NAME | = DA1 ,DA2 ,DA3 ,DA4 ,SEL |
| | : DT | = 10 |
| | ; | |
| OUTTIM | : NAME | = OUT |
| | : STB1 | = 60 |
| | ; | |
| ENDTIM | ; | |
| SIGNAL | ; | |
| VECTOR | : NAME | = FN1 |

:FORM= CLK,@1,CLR,@1,DA1,@1,DA2,@1,DA3,@1,DA4,
@1,SEL,@2,OUT

| | | | | | | | | |
|---|---|---|---|---|---|---|---|---|
| 1 | P | 0 | 1 | 0 | 0 | 0 | 0 | X |
| 2 | P | 1 | 1 | 0 | 0 | 0 | 0 | X |
| 3 | P | 1 | 1 | 1 | 0 | 0 | 0 | X |
| 4 | P | 1 | 0 | 0 | 1 | 1 | 0 | X |
| 5 | P | 1 | 1 | 1 | 0 | 1 | 0 | X |
| 6 | P | 1 | 0 | 1 | 0 | 1 | 0 | X |
| 7 | P | 1 | 0 | 0 | 0 | 0 | 0 | X |
| 8 | P | 1 | 1 | 1 | 1 | 0 | 0 | X |
| 9 | P | 1 | 1 | 0 | 1 | 0 | 1 | X |
| 0 | P | 1 | 1 | 1 | 1 | 0 | 1 | X |
| 11 | P | 1 | 0 | 0 | 0 | 0 | 1 | X |
| 12 | P | 1 | 1 | 1 | 1 | 0 | 1 | X |
| 13 | P | 1 | 1 | 0 | 1 | 0 | 1 | X |
| | ENDVECT | | | | | | | ; |
| | ENDSIG | | | | | | | ; |
| | ENDTEST | | | | | | | ; |

Also, a list of output signal data indicating a result of the logic simulation is shown in Table 3 below. Note, Note, numerals 0, 47, 50, 65, 70, . . . , indicate a lapse of time from the beginning of the logic simulation. Unit of the time is 0.1 [ns]. Also, reference "X" indicates an "indefinite" state and reference "E" indicates a "hazard" state.

TABLE 3

| | CLK | CLR | DA1 | DA2 | DA3 | DA4 | SEL | OUT | P10K#X | P10L#X | P10H#X | P10M#X | P10F#Q | P10J#XQ | P10G#Q | P10P#X | P10P#X |
|---|---|---|---|---|---|---|---|---|---|---|---|---|---|---|---|---|---|
| 0 | 0 | X | X | X | X | X | X | X | X | X | X | X | X | X | X | X | X |
| 47 | 0 | X | X | X | X | X | X | X | X | X | X | X | E | E | X | X | X |
| 50 | 0 | 0 | X | X | X | X | X | X | X | X | X | X | E | E | X | X | X |
| 65 | 0 | 0 | X | X | X | X | X | X | X | X | X | X | E | E | E | X | X |
| 70 | 1 | 0 | X | X | X | X | X | X | X | X | X | X | E | E | E | X | X |
| 87 | 1 | 0 | X | X | X | X | X | X | X | X | X | X | E | E | E | E | X |
| 97 | 1 | 0 | X | X | X | X | X | X | X | X | X | X | 0 | 0 | E | E | E |
| 100 | 1 | 0 | 1 | 0 | 0 | 0 | 0 | X | X | X | X | X | 0 | 0 | E | E | E |
| . | | | | | | | | | | | | | | | | | |
| . | | | | | | | | | | | | | | | | | |
| 12123 | 1 | 1 | 1 | 0 | 1 | 0 | 1 | 1 | 0 | 0 | 0 | 0 | 0 | 1 | 1 | 1 | 1 |
| 12132 | 1 | 1 | 1 | 0 | 1 | 0 | 1 | 1 | 0 | 0 | 0 | 0 | 0 | 1 | 1 | 0 | 1 |
| 12320 | 0 | 1 | 1 | 0 | 1 | 0 | 1 | 1 | 0 | 0 | 0 | 0 | 0 | 1 | 1 | 0 | 1 |
| 12353 | 0 | 1 | 1 | 0 | 1 | 0 | 1 | 1 | 0 | 0 | 0 | 0 | 0 | 1 | 1 | 0 | 1 |

Furthermore, a list of data indicating the number of times of transition of the output signal (i.e., output data of the circuit 16) is shown in Table 4 below.

TABLE 4

| * COUNT * | TERMINAL NAME |
|---|---|
| 1 | CLR, SEL, P10K#X |
| 2 | DA4, OUT, P10L#X |

TABLE 4-continued

| * COUNT * | TERMINAL NAME |
|---|---|
| 4 | P10P#X |
| 5 | DA3 |
| 6 | DA1, P10N#X |
| 7 | P10H#X |
| 8 | P10J#XQ |
| 9 | P10M#X |
| 10 | DA2 |
| 11 | P10G#Q |
| 12 | P10F#Q |
| 26 | CLK |

For example, the operational frequency "F" of the terminal name "P10J#XQ" is determined based on the formula (1) as follows:

$$F=8/2/(100\times13)\times1000=3[MHz]$$

Although, in the above embodiment, the wiring width of the compensating basic power supply line 44 is selected to be equal to that of the basic power supply line 43, the former may be selected to be different from the latter.

Although the present invention has been disclosed and described by way of one embodiment, it is apparent to those skilled in the art that other embodiments and modifications of the present invention are possible without departing from the spirit or essential features thereof.

I claim:

1. A method of determining power supply wirings of a semiconductor device, comprising the steps of:

executing a logic simulation based on both data concerning each of logic circuit blocks constituting the semiconductor device and data concerning signals for testing operations of the semiconductor device;

computing a respective operational frequency of the logic circuit blocks based on a result of the logic simulation; and determining a respective. wiring width of each power supply line for supplying each of the logic circuit blocks with powers, in accordance with the respective operational frequency of the logic circuit blocks, wherein, when the respective power supply line for each logic circuit block comprises at least one basic power supply line having a predetermined wiring width, the step of determining a respective wiring width includes the substeps of determining the number of the basic power supply line constituting the respective power supply line for each logic circuit block, according to the operational frequency of the logic circuit block concerned, and determining both a wiring width of the power supply line concerned and a wiring space between each basic power supply line.

2. A method as set forth in claim 1, wherein the step of computing a respective operational frequency includes the substeps of computing the number of times of transition in level of an output signal based on the logic simulation within a predetermined test time, executing a multiplication between a period of an operation test signal corresponding to the output signal and a waveform number of the operation test signal, to thereby compute the predetermined test time, and computing the operational frequency of the logic circuit block concerned.

3. An apparatus for determining power supply wirings of a semiconductor device, comprising;

a logic simulating means for executing a logic simulation based on both data concerning each of logic circuit blocks constituting the semiconductor device and data concerning signals for testing operations of the semiconductor device, and thereby generating a respective output signal data for the logic circuit blocks;

a frequency computing means for computing a respective operational frequency of the logic circuit blocks based on the output signal data from the logic simulating means; and a power supply line determining means for computing a respective wiring width of each power supply line for supplying each of the logic circuit blocks with powers, based on the respective operational frequency of the logic circuit blocks computed by the frequency computing means and a plurality of wiring widths of respective power supply lines optimumly selected for each of a plurality of operational frequencies in advance, wherein the respective power supply line for each logic circuit block comprises at least one basic power supply line having a predetermined wiring width, and the power supply line determining means comprises means for computing the number of the basic power supply line constituting the respective power supply line for each logic circuit block, according to the operational frequency of the logic circuit block concerned, and means, responsive to the computed number, for computing both a wiring width of the power supply line concerned and a wiring space between each basic power supply line.

4. An apparatus as set forth in claim 3, wherein the power supply line determining means comprises means for storing data concerning a wiring width and a wiring space of a respective power supply line optimumly selected for each operational frequency of a plurality of logic circuit blocks in advance.

5. An apparatus as set forth in claim 3, wherein the frequency computing means comprises a circuit, responsive to the output signal data, for computing the number of times of transition in level of the output signal within a predetermined test time;

a circuit, responsive to data concerning an operation test signal corresponding to the output signal data concerned, for computing the predetermined test time; and a circuit, responsive to the computed number of times of transition of the output signal and the computed test time, for computing the operational frequency of the logic circuit block concerned.

6. An apparatus as set forth in claim 5, wherein the data concerning the operation test signal includes data concerning an operation clock signal for the semiconductor device, the operation clock signal having a constant period and a constant number of patterns.

7. An apparatus as set forth in claim 5, further comprising means for storing the data concerning each logic circuit block, the data concerning the operation test signal of the semiconductor device, and the output signal data generated from the logic simulating means, respectively, and independently of one another.

8. An apparatus as set forth in claim 7, wherein the power supply line for a logic circuit block having a relatively low operational frequency is constituted by first basic power supply lines each having a predetermined wiring width, and the power supply line for a logic circuit block having a relatively high operational frequency is constituted by both the first basic power supply lines and second basic power supply lines each having a predetermined wiring width and provided with the wiring space therebetween.

9. An apparatus as set forth in claim 8, wherein when the wiring width of the second basic power supply line is selected to be equal to that of the first basic power supply line, the wiring width of the power supply line for each logic circuit block is defined by the sum of wiring widths of all of the first and/or second basic power supply lines constituting the power supply line concerned.

* * * * *